United States Patent
Kwon et al.

(10) Patent No.: US 9,059,113 B2
(45) Date of Patent: Jun. 16, 2015

(54) ORGANIC LIGHT-EMITTING DEVICE

(75) Inventors: O-Hyun Kwon, Yongin-si (KR);
Dong-Woo Shin, Yongin-si (KR); Kyul Han, Yongin-si (KR); Seul-Ong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 281 days.

(21) Appl. No.: 13/597,217

(22) Filed: Aug. 28, 2012

(65) Prior Publication Data

US 2013/0175508 A1 Jul. 11, 2013

(30) Foreign Application Priority Data

Jan. 5, 2012 (KR) .................. 10-2012-0001552

(51) Int. Cl.
*H01L 29/72* (2006.01)
*H01L 27/32* (2006.01)
*H01L 51/00* (2006.01)
*H01L 51/50* (2006.01)
*H01L 51/52* (2006.01)

(52) U.S. Cl.
CPC ........... *H01L 27/3211* (2013.01); *H01L 51/002* (2013.01); *H01L 2251/308* (2013.01); *H01L 51/5004* (2013.01); *H01L 51/5024* (2013.01); *H01L 51/5265* (2013.01)

(58) Field of Classification Search
CPC ................................... H01L 51/0545
USPC ............................. 257/40, E51.026
See application file for complete search history.

(56) References Cited

U.S. PATENT DOCUMENTS

| | | | |
|---|---|---|---|
| 2004/0124766 A1* | 7/2004 | Nakagawa et al. | 313/504 |
| 2005/0164033 A1* | 7/2005 | Chin et al. | 428/690 |
| 2008/0197771 A1 | 8/2008 | Yoon | |
| 2011/0233604 A1 | 9/2011 | Ikeda | |
| 2011/0240965 A1* | 10/2011 | Yoon et al. | 257/40 |

FOREIGN PATENT DOCUMENTS

| | | |
|---|---|---|
| KR | 10-2010-0076789 A | 7/2010 |
| KR | 10-2011-0087214 A | 8/2011 |
| KR | 10-2011-0107292 | 9/2011 |
| KR | 10-2011-0110589 | 10/2011 |

* cited by examiner

*Primary Examiner* — Edward Wojciechowicz
(74) *Attorney, Agent, or Firm* — Christie, Parker & Hale, LLP

(57) ABSTRACT

An organic light-emitting device includes a substrate; a first electrode layer and a second electrode layer on the substrate, in parallel to the substrate, and facing each other; an emission layer between the first electrode layer and the second electrode layer, where the emission layer includes a first emission region, a second emission region, and a third emission region, where the emission layer includes a first common emission layer in the first emission region, the second emission region, and the third emission region; a second emission layer in the second emission region between the first common emission layer and the second electrode layer; and a third emission layer in the third emission region between the first common emission layer and the second electrode layer, and where the first common emission layer includes a first host, a first dopant, and a p-type dopant.

20 Claims, 2 Drawing Sheets

ORGANIC LIGHT-EMITTING DEVICE

CROSS-REFERENCE TO RELATED PATENT APPLICATION

This application claims priority to and the benefit of Korean Patent Application No. 10-2012-0001552, filed on Jan. 5, 2012 in the Korean Intellectual Property Office, the entire content of which is incorporated herein by reference.

BACKGROUND

1. Technical Field

The present invention relates to an organic light-emitting device and a method of manufacturing the same, and more particularly, to an organic light-emitting device including a common emission layer and a method of manufacturing the organic light-emitting device.

2. Description of the Related Art

Organic light-emitting devices (OLEDs) are self-light emitting devices that emit light when a voltage is applied thereto. OLEDs have high luminance, good contrast, wide viewing angles, high response speeds, and low driving voltages. OLEDs can also render multi-colored images.

An organic light-emitting device has a structure including an organic emission layer disposed between an anode and a cathode. When a voltage is applied across the electrodes, holes are injected from the anode and electrons are injected from the cathode into the organic emission layer. The injected holes and electrons undergo electron exchanges in adjacent molecules in the organic emission layer, thereby migrating to opposite electrodes. An electron-hole pair recombined in a certain molecule forms a molecular exciton in a high-energy excited state. The molecular excitons emit unique wavelengths of light upon returning to a low-energy ground state.

An organic light-emitting device includes a plurality of pixels and each pixel includes a red light-emitting region, a green light-emitting region, and a blue light-emitting region. In this case, a patterning process may be simplified by forming the blue light-emitting layer as a common layer. By forming an emission layer to have host and dopant structures, external quantum efficiency is increased and the emission wavelength is controlled.

SUMMARY

When a blue emission layer as a common layer includes a host and a dopant, hole transporting efficiency is reduced. Thus, embodiments of the present invention include an organic light-emitting device including a common emission layer, thereby increasing hole transporting efficiency.

According to an aspect of the present invention, an organic light-emitting device includes a substrate; a first electrode layer and a second electrode layer formed on the substrate and parallel to the substrate such that the first and second electrode layers face each other; an emission layer between the first electrode layer and the second electrode layer, wherein the emission layer includes a first emission region, a second emission region, and a third emission region, wherein the emission layer includes a first common emission layer in the first emission region, the second emission region, and the third emission region; a second emission layer in the second emission region between the first common emission layer and the second electrode layer; and a third emission layer in the third emission region between the first common emission layer and the second electrode layer, and wherein the first common emission layer includes a first host, a first dopant, and a p-type dopant.

A difference between the lowest unoccupied molecular orbital (LUMO) energy level of the p-type dopant and the highest occupied molecular orbital (HOMO) energy level of the first host may range from about 0.2 to about 1.0 eV.

The p-type dopant may have a LUMO energy level that is equal to or less than 5.5 eV.

The p-type dopant may include 2,3,5,6-tetrafluoro-7,7',8,8'-tetracyanoquinodimethane (F4TCNQ), 7,7',8,8'-tetracyanoquinodimethane (TCNQ), a perylene-3,4,9,10-tetracarboxylic-3,4,9,10-dianhydride (PTCDA), 1,3,2-dioxaborine derivative, $FeCl_3$, $FeF_3$, or $SbCl_5$.

An amount of the p-type dopant may be about 0.5 to about 3 wt % based on a total weight of the first common emission layer.

The first emission region may be a blue emission region, the second emission region may be a red emission region, and the third emission region may be a green emission region. The first common emission layer may be a blue common emission layer.

The first common emission layer may include a red common emission layer or a green common emission layer.

The organic light-emitting device may further include a hole injection layer or a hole transfer layer between the first electrode layer and the emission layer. The organic light-emitting device may further include an electron injection layer or an electron transfer layer between the second electrode layer and the emission layer.

The organic light-emitting device may further include a resonance layer between the emission layer and the second electrode layer. The resonance layer may have a thickness that varies in the first emission region, the second emission region, and the third emission region according to resonance distances of the first emission region, the second emission region, and the third emission region. The resonance layer may include an electron transfer layer.

The first electrode layer may be an anode, and the second electrode layer may be a cathode.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Hereinafter, the present invention will be described in detail by explaining embodiments of the invention with reference to the attached drawings.

Figure 1:
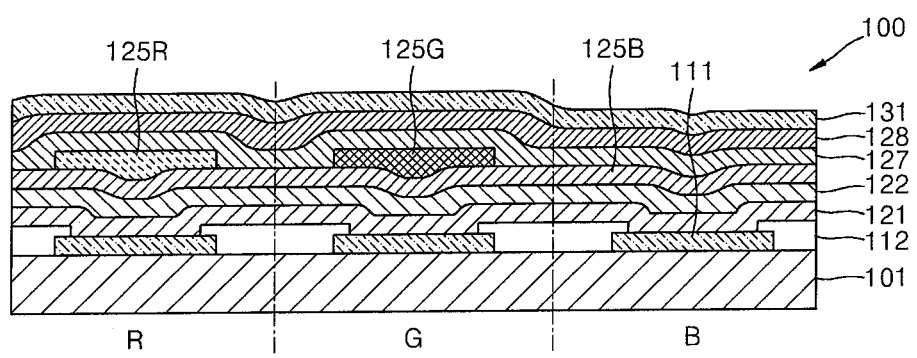
FIG. 1 is a schematic cross-sectional view of an organic light-emitting device according to an embodiment of the present invention.

FIG. 1 is a schematic cross-sectional view of an organic light-emitting device 100 according to an embodiment of the present invention. The organic light-emitting device 100 includes sub-pixel regions including a red light-emitting region R, a green light-emitting region G, and a blue light-emitting region B. Reference numeral 112 indicates an insulating layer that defines a sub-pixel region.

The organic light-emitting device 100 includes a substrate 101, an anode 111, a hole injection layer 121, a hole transfer layer 122, an emission layer 125, an electron transfer layer 127, an electron injection layer 128, and a cathode 131.

The substrate 101 may be any substrate that is used in existing organic light emitting devices. In some embodiments, the substrate may be a glass substrate or a transparent plastic substrate with good mechanical strength, thermal stability, transparency, surface smoothness, ease of handling, and water resistance. The substrate 101 may be formed of an opaque material such as silicon, stainless steel, or the like.

The anode 111 may be formed of a material with a relatively high work function. The anode 111 may be formed of, but is not limited to, a transparent conductive oxide, for example, indium tin oxide (ITO), indium zinc oxide (IZO), zinc oxide (ZnO), Al-doped zinc oxide (AZO), indium oxide (In$_2$O$_3$) or tin oxide (SnO$_2$). The anode 111 may be formed by vapor deposition or sputtering.

The hole injection layer 121 may be formed of, for example, a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4'4''-tris(N,N-diphenylamino)triphenylamine (TDATA), 4,4',4''-tris{N,-(2-naphthyl)-N-phenylamino}-triphenylamine (2T-NATA), poly(3,4-ethylenedioxythiophene)/poly(4-styrenesulfonate) (PEDOT/PSS), polyaniline/dodecylbenzenesulfonic acid (Pani/DBSA), polyaniline/Camphor sulfonicacid (Pani/CSA), polyaniline/poly(4-styrenesulfonate) (PANI/PSS), or the like, but is not limited thereto.

m-MTDATA

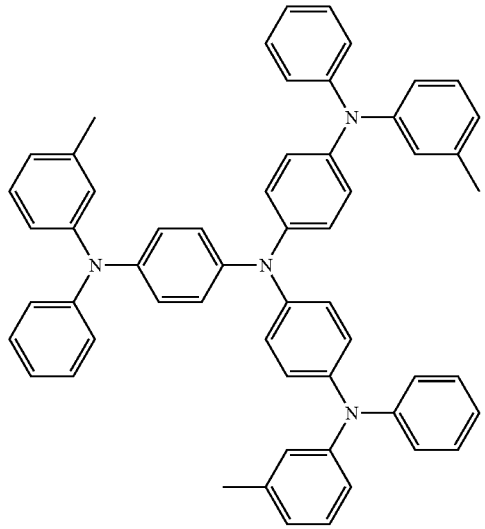

TDATA

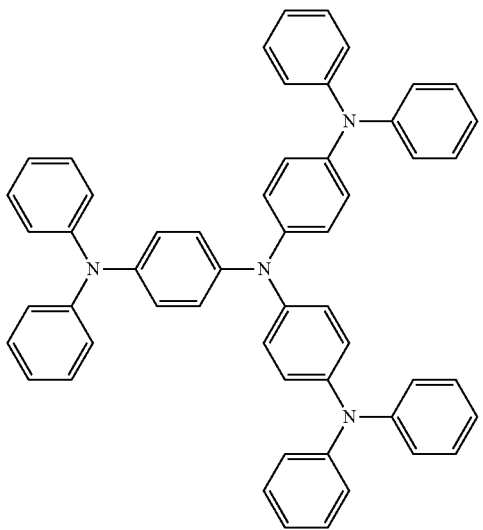

2T-NATA

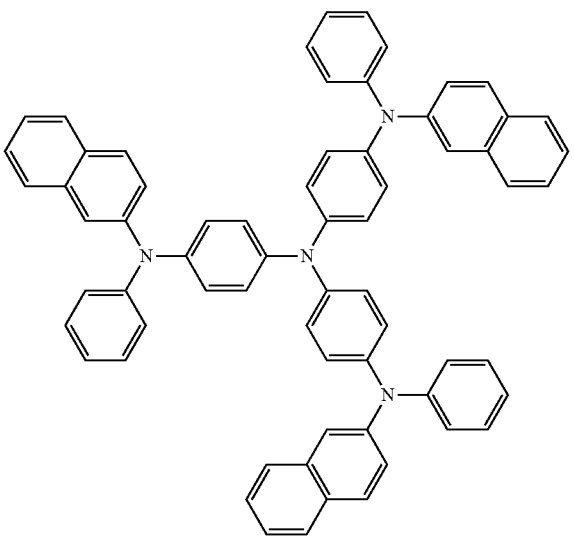

PEDOT/PSS

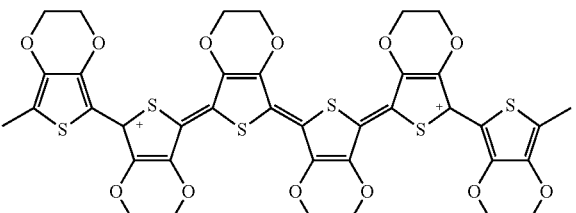

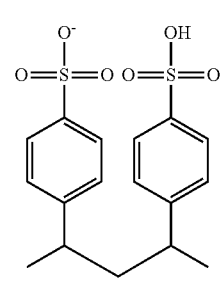

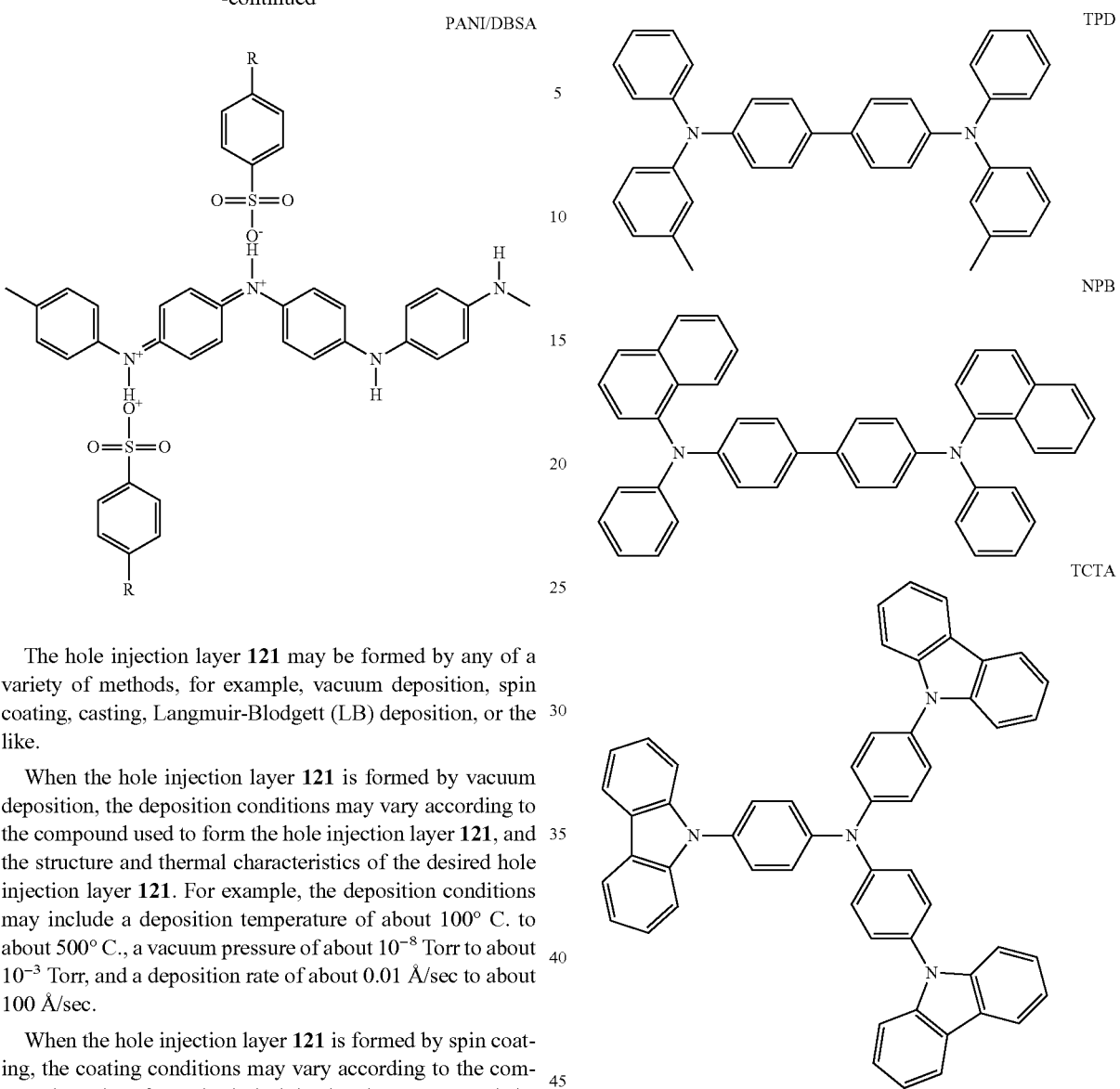

The hole injection layer 121 may be formed by any of a variety of methods, for example, vacuum deposition, spin coating, casting, Langmuir-Blodgett (LB) deposition, or the like.

When the hole injection layer 121 is formed by vacuum deposition, the deposition conditions may vary according to the compound used to form the hole injection layer 121, and the structure and thermal characteristics of the desired hole injection layer 121. For example, the deposition conditions may include a deposition temperature of about 100° C. to about 500° C., a vacuum pressure of about $10^{-8}$ Torr to about $10^{-3}$ Torr, and a deposition rate of about 0.01 Å/sec to about 100 Å/sec.

When the hole injection layer 121 is formed by spin coating, the coating conditions may vary according to the compound used to form the hole injection layer 121, and the structure and thermal characteristics of the desired hole injection layer 121. For example, the deposition conditions may include a coating speed of about 2,000 rpm to about 5,000 rpm, and a thermal treatment temperature of about 80° C. to about 200° C. at which the solvent remaining after coating may be removed.

The hole injection layer 121 may have a thickness of about 100 Å to about 10000 Å, and in some embodiments, may have a thickness of about 100 Å to about 1000 Å. When the thickness of the hole injection layer 121 is within these ranges, the hole injection layer 121 may achieve satisfactory hole injecting ability without substantially decreasing driving voltage.

The hole transfer layer 122 may include, for example, a carbazole derivative, such as N-phenylcarbazole or polyvinyl carbazole, N,N'-bis(3-methylphenyl)-N,N'-diphenyl-[1,1-biphenyl]-4,4'-diamine (TPD), 4,4'-bis[N-(1-naphthyl)-N-phenylamino]biphenyl (NPB), 4,4',4"-tris(N-carbazolyl)triphenylamine (TCTA), or the like, but is not limited thereto.

The hole transfer layer 122 may be formed by any of a variety of methods, for example, vacuum deposition, spin coating, casting, Langmuir-Blodgett (LB) deposition, or the like. When the hole transfer layer 122 is formed by vacuum deposition or spin coating, the deposition conditions or the coating conditions may vary according to the compound used to form the hole transfer layer 122, but in some embodiments may be substantially the same as those used to form the hole injection layer 121.

The hole transport layer 122 may have a thickness of about 50 Å to about 1000 Å, and in some embodiments, the hole transport layer 122 may have a thickness of about 100 Å to about 800 Å. When the thickness of the hole transport layer 122 is within these ranges, the hole transport layer 122 may have satisfactory hole transporting ability without substantially decreasing driving voltage.

Optionally, the hole injection layer 121 and the hole transfer layer 122 may be replaced by a functional layer having both hole injection and hole transfer capabilities.

The emission layer 125 may include a red emission layer 125R, a green emission layer 125G, and a blue common emission layer 125B. According to the present embodiment, the blue common emission layer 125B is formed as a common layer on the hole transfer layer 122 across the red light-emitting region R, the green light-emitting region G, and the blue light-emitting region B. The red emission layer 125R is patterned in the red emission region. The green emission layer 125G is patterned in the green emission region. The red emission layer 125R and the green emission layer 125G are disposed on the blue common emission layer 125B.

The blue common emission layer 125B may include a blue host, a blue dopant, and a p-type dopant.

Non-limiting examples of the blue host include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), or the like.

CBP

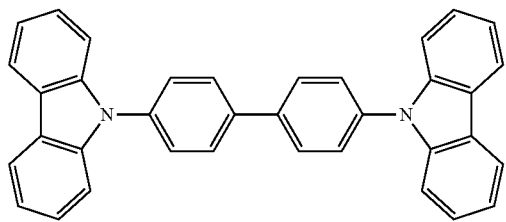

dmCBP

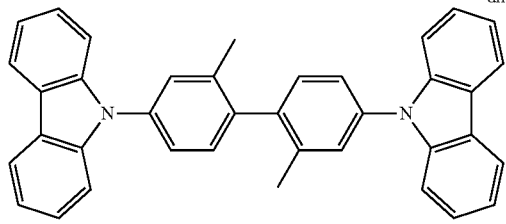

ADN

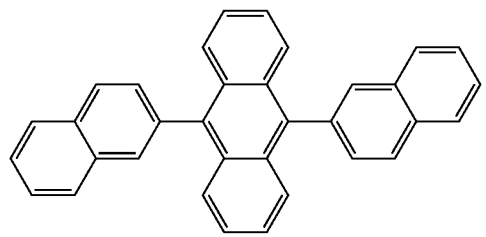

TBADN

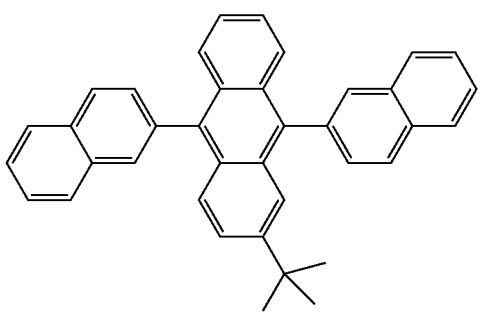

TPBI

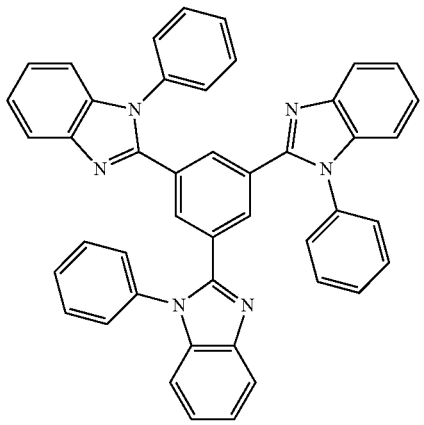

PVK

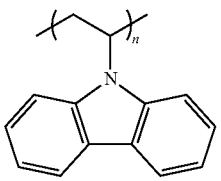

E3

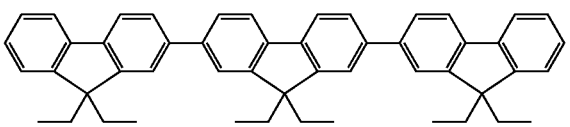

Non-limiting examples of the blue dopant include $F_2Irpic$, $(F_2ppy)_2Ir(tmd)$, $Ir(dfppz)_3$, ter-fluorene, 4,4'-bis(4-diphenylaminostyryl)biphenyl (DPAVBi), and 2,5,8,11-tetra-t-butylperylene (TBPe), which are represented by the compounds below:

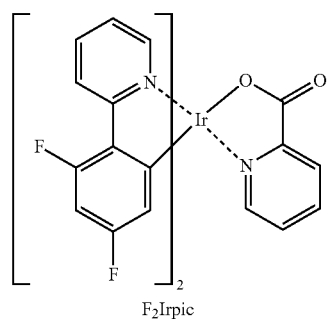

$F_2Irpic$

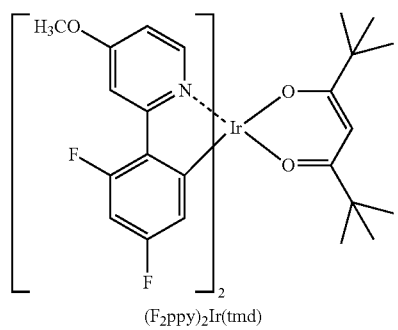

$(F_2ppy)_2Ir(tmd)$

-continued
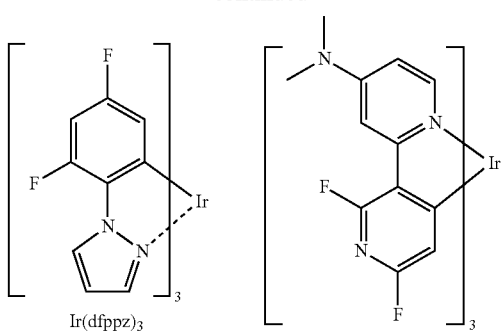
Ir(dfppz)₃
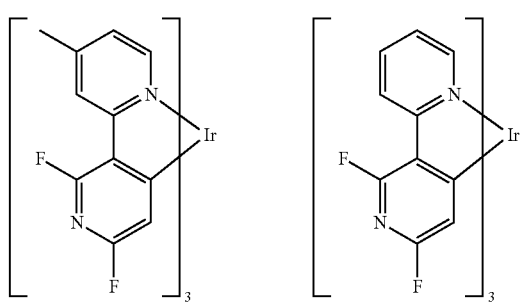
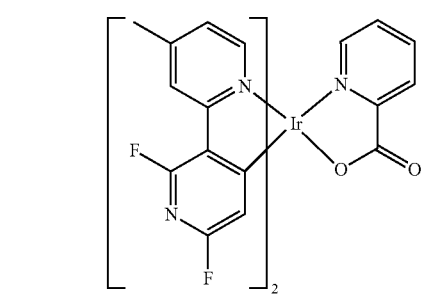
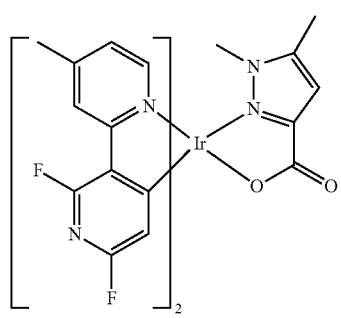
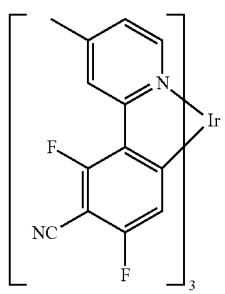
-continued
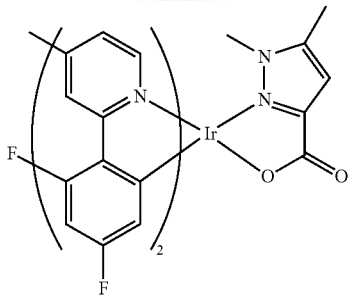
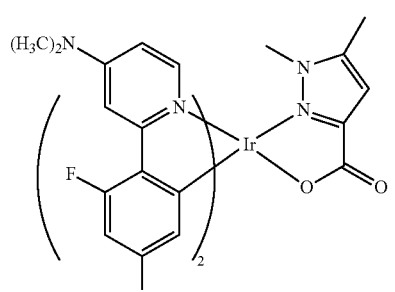
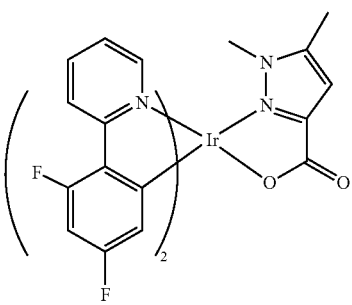
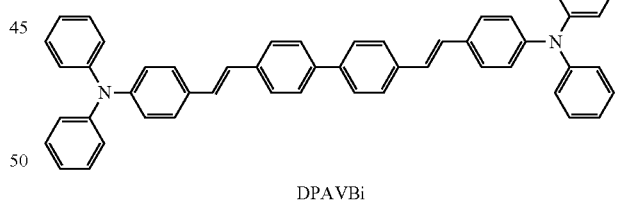
DPAVBi
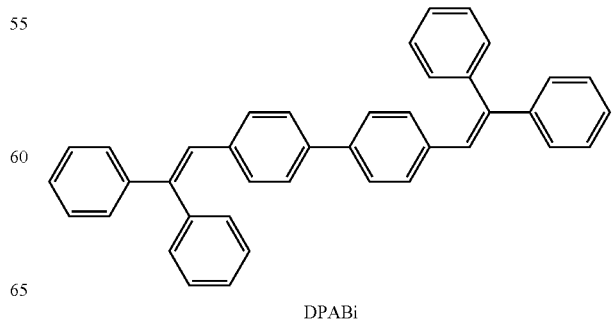
DPABi

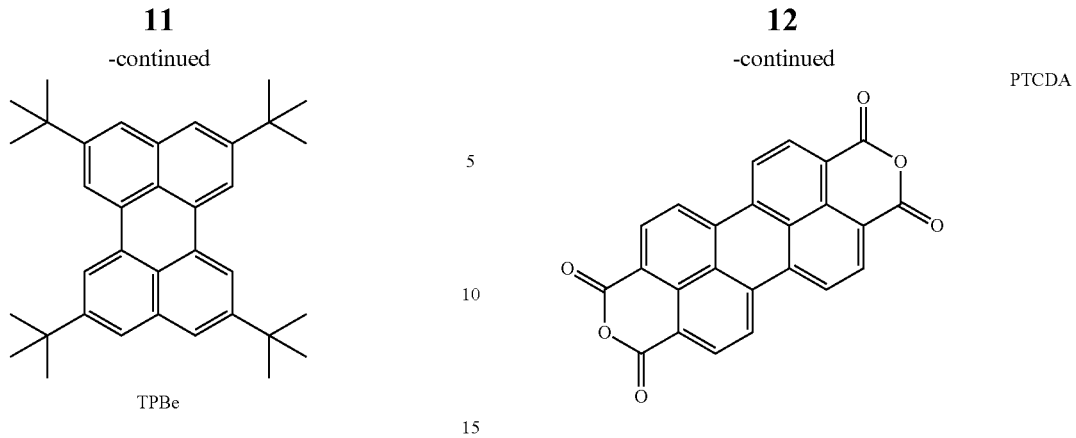

TPBe

PTCDA

The p-type dopant may be a material that generates holes in a blue host so as to increase the hole transporting efficiency of the blue host. The p-type dopant that generates holes in the blue host may be a p-type dopant having a lowest unoccupied molecular orbital (LUMO) energy level that is similar to the highest occupied molecular orbital (HOMO) energy level of the blue host. For example, a difference between the LUMO energy level of the p-type dopant and the HOMO energy level of the blue host may range from about 0.2 to about 1.0 eV. The LUMO energy level of the p-type dopant is similar to the HOMO energy level of the blue dopant or is equal to or lower than 5.5 eV (which is lower than the HOMO energy level of the blue dopant), and thus may have good electron accepting capacity.

Non-limiting examples of the p-type dopant include organic compounds such as 2,3,5,6-tetrafluoro-7,7',8,8'-tetracyanoquinodimethane (F4TCNQ), 7,7',8,8'-tetracyanoquinodimethane (TCNQ), perylene-3,4,9,10-tetracarboxylic-3,4,9,10-dianhydride (PTCDA), or 1,3,2-dioxaborine derivatives, and inorganic compounds such as iodine, $FeCl_3$, $FeF_3$, $SbCl_5$, metal chloride, or metal fluoride.

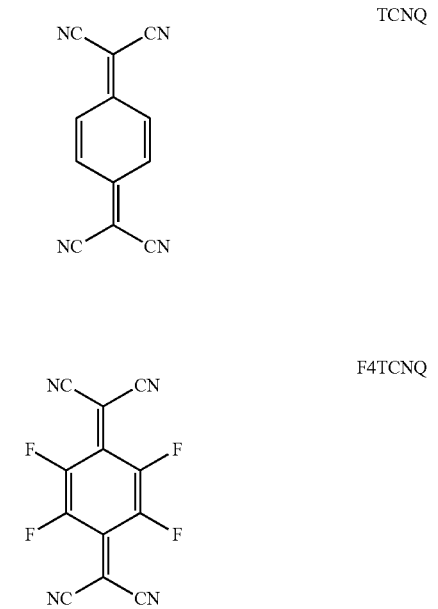

TCNQ

F4TCNQ

Figure 2:
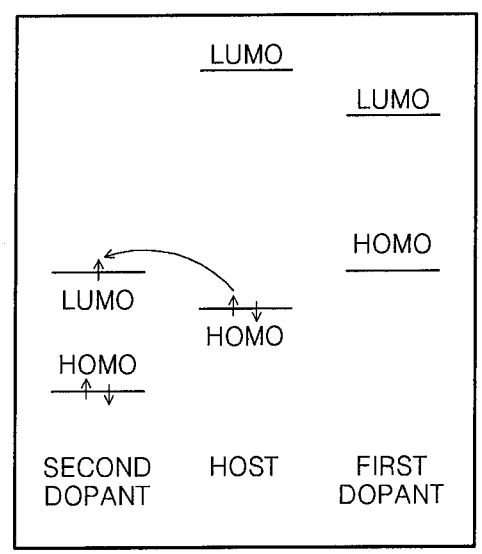
FIG. 2 is a diagram of the energy levels of a host, an emission dopant, and a p-type dopant in a blue common emission layer according to an embodiment of the present invention.

FIG. 2 is a diagram of the energy levels of a host, an emission dopant, and a p-type dopant included in the blue common emission layer 125B according to an embodiment of the present invention. Referring to FIG. 2, the HOMO energy level of the host is lower than the HOMO energy level of the emission dopant (first dopant), and thus holes with a HOMO energy level of the host may be easily transferred to the HOMO energy level of the emission dopant. Thus, the emission dopant may serve as a trap-site for the holes of the host. However, due to the existence of the p-type dopant (second dopant) having a HOMO energy level that is much lower than the HOMO energy level of the host, and having a LUMO energy level that is similar to the HOMO energy level of the host, electrons with a HOMO energy level of the host may be transferred to a LUMO energy level of the p-type dopant. Since electrons with a HOMO energy level of the host can be transferred to a LUMO energy level of the p-type dopant, holes may be generated in a HOMO energy level of the host, thereby increasing the hole transporting efficiency of the host.

According to the present embodiment, since the p-type dopant increases the hole transporting efficiency of the blue host, holes that are injected from the anode 111 and pass through the hole injection layer 121 and the hole transfer layer 122 may reach the red emission layer 125R or the green emission layer 125G such that the speed of the holes may not be reduced in the blue common emission layer 125B.

The red emission layer 125R may include a red host and a red dopant. Like the blue host, non-limiting examples of the red host include $Alq_3$, CBP, PVK, ADN, TCTA, TPBI, TBADN, E3, DSA, or the like. Non-limiting examples of the red dopant include PtOEP, $Ir(piq)_3$, $Btp_2Ir(acac)$, $Ir(piq)_2(acac)$, $Ir(2-phq)_2(acac)$, $Ir(2-phq)_3$, $Ir(flq)_2(acac)$, $Ir(fliq)_2(acac)$, DCM, DCJTB, and the like, which are represented by the compounds below.

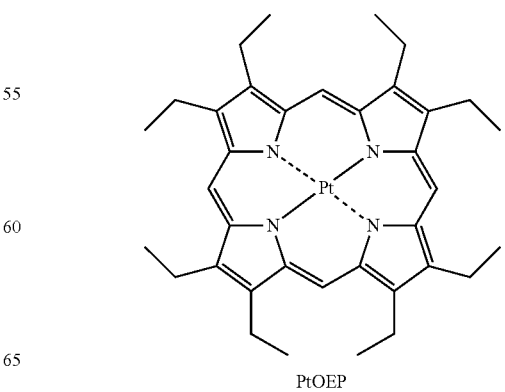

PtOEP

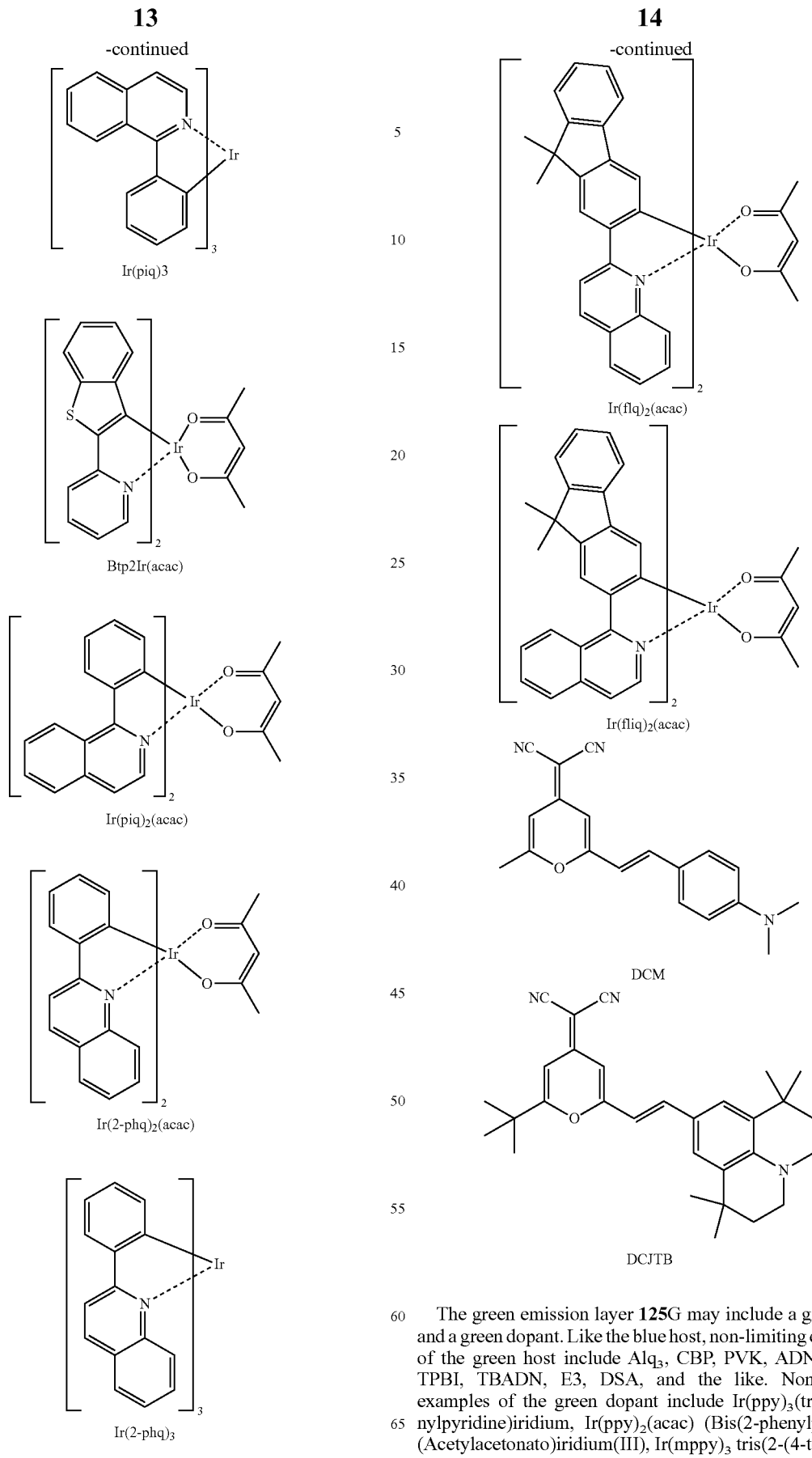

The green emission layer 125G may include a green host and a green dopant. Like the blue host, non-limiting examples of the green host include Alq$_3$, CBP, PVK, ADN, TCTA, TPBI, TBADN, E3, DSA, and the like. Non-limiting examples of the green dopant include Ir(ppy)$_3$(tris(2-phenylpyridine)iridium, Ir(ppy)$_2$(acac) (Bis(2-phenylpyridine)(Acetylacetonato)iridium(III), Ir(mppy)$_3$ tris(2-(4-tolyl)phenylpiridine)iridium, 10-(2-benzothiazolyl)-1,1,7,7- tetramethyl-2,3,6,7-tetrahydro-1H,5H,11H-[1]benzopyrano [6,7,8-ij]-quinolizin-11-one (C545T), or the like.

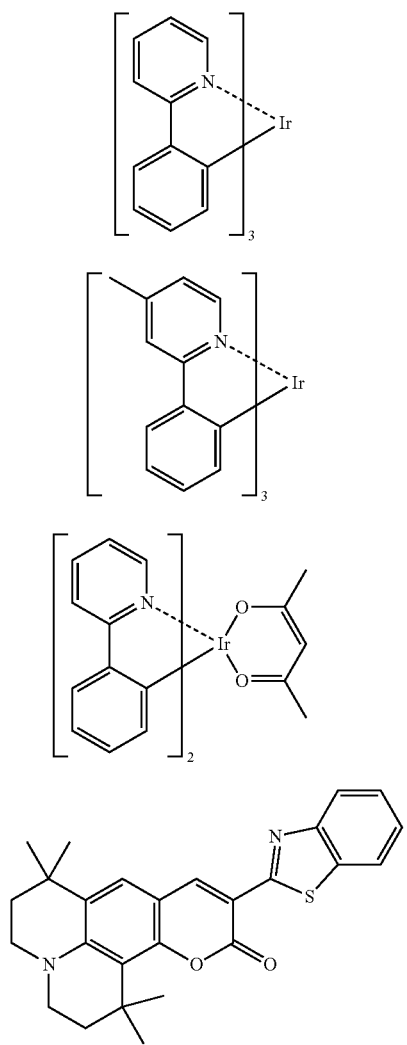

The red emission layer 125R, the green emission layer 125G, and the blue common emission layer 125B may be formed by vacuum deposition, spin coating, casting, Langmuir-Blodgett (LB) deposition, or the like. When the red emission layer 125R, the green emission layer 125G, or the blue common emission layer 125B are formed by vacuum deposition or spin coating, the deposition or coating conditions may vary according to the compound used to form the red emission layer 125R, the green emission layer 125G, or the blue common emission layer 125B, but in some embodiments may be substantially the same as those used to form the hole injection layer. In order to form a layer including a host and a dopant, a code position method may be used.

The amount of the dopant in each of the red emission layer 125R and the green emission layer 125G, and the amount of the blue dopant in the blue common emission layer 125B may range, but is not limited to, from about 0.01 wt % to about 15 wt % based on the total weight of each emission layer. The amount of the p-type dopant in the blue common emission layer 125B may range from about 0.5 wt % to about 3 wt % based on the total weight of the blue common emission layer 125B. When included within this range, the p-type dopant may effectively generate holes in the blue host, thereby increasing the hole transporting efficiency of the blue host.

The red emission layer 125R, the green emission layer 125G, and the blue common emission layer 125B may each have a thickness of about 100 Å to about 1,000 Å.

The electron transfer layer 127 may be a layer that transfers holes injected from the cathode 131 to each emission layer and may include a known material, for example, Alq$_3$, 2,9-Dimethyl-4,7-diphenyl-1,10-phenanthroline (BCP) 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), BAlq (refer to the following formula), beryllium bis(benzoquinolin-10-olate) (Bebq$_2$), 9,10-di(naphthalene-2-yl)anthracene (AND), Compound 101 below, Compound 102 below, or the like, but is not limited thereto.

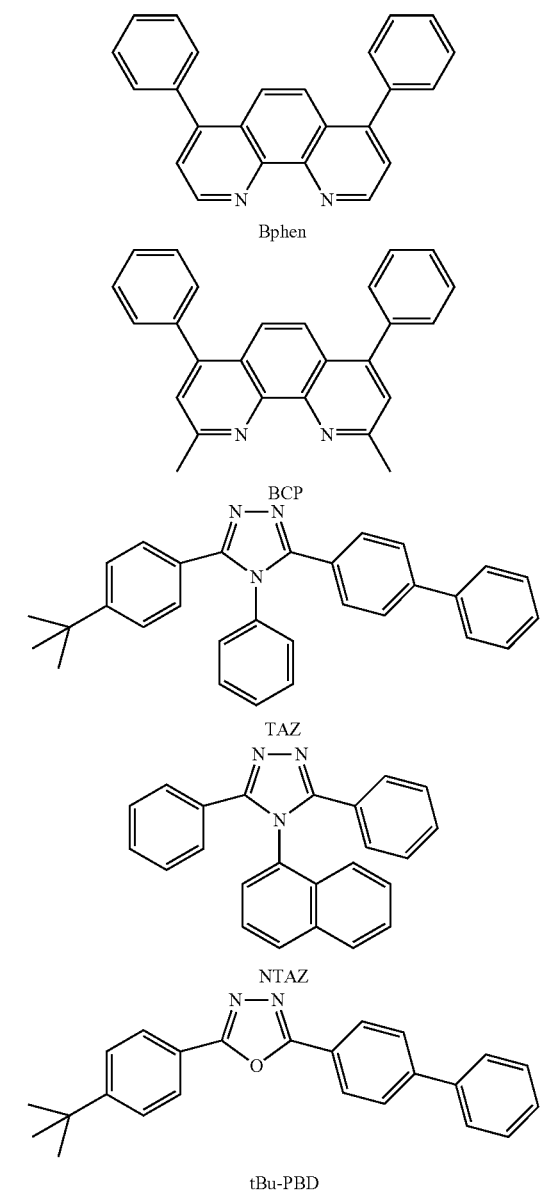

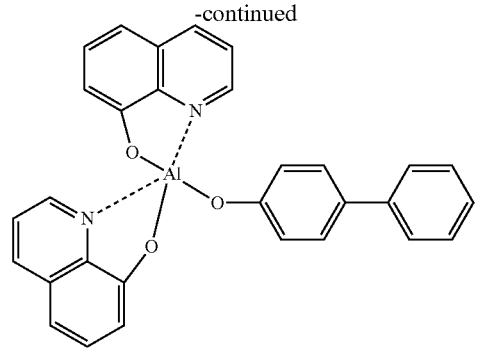

BAlq

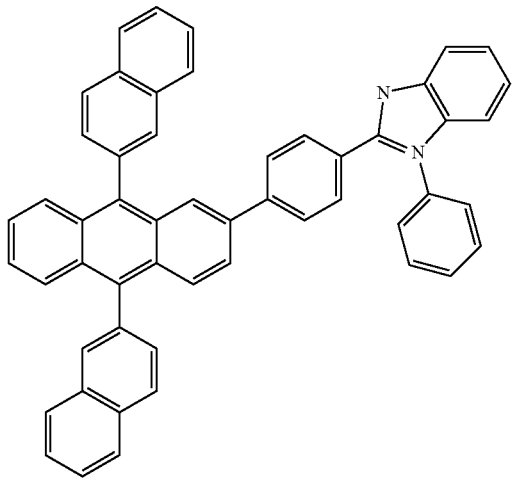

compound 101

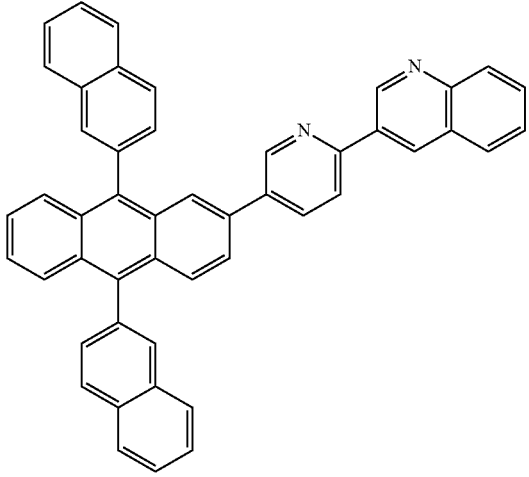

compound 102

The electron transfer layer 127 may be formed by any of a variety of methods, for example, vacuum deposition, spin coating, casting, or the like. When the electron transfer layer 127 is formed by vacuum deposition or spin coating, the deposition or coating conditions may vary according to the compound used to form the electron transfer layer 127, but in some embodiments may be substantially the same as those used to form the hole injection layer 121.

The electron transfer layer 127 may have a thickness of about 100 Å to about 1,000 Å, for example, about 150 Å to about 500 Å. When the thickness of the electron transfer layer 127 is within these ranges, the electron transfer layer 127 may have satisfactory hole transporting ability without substantially increasing driving voltage.

The electron transfer layer 127 may include an electron transporting organic compound and a metal-containing material. The metal-containing material may include a lithium (Li) complex. Non-limiting examples of the Li complex include lithium quinolate (LiQ), Formula 103 below, or the like.

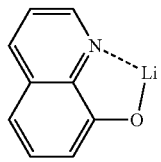

LiQ

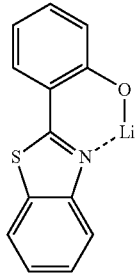

Formula 103

The electron injection layer 128 for facilitating injection of electrons from the cathode 131 may be stacked on the electron transfer layer 127. The electron injection layer 128 may be formed of a known material for forming an electron injection layer, such as LiF, NaCl, CsF, $Li_2O$, BaO, or the like, but is not limited thereto. The deposition conditions of the electron injection layer 128 may vary according to the compound used to form the electron injection layer 128, but in some embodiments, may be substantially the same as those used to form the hole injection layer 121.

The electron injection layer 128 may have a thickness of about 1 Å to about 100 Å, for example, about 3 Å to about 90 Å. When the thickness of the electron injection layer 128 is within these ranges, the electron injection layer 128 may have satisfactory electron injection ability without substantially increasing driving voltage.

Optionally, the electron transfer layer 127 and the electron injection layer 128 may be replaced by a functional layer having both electron transfer and electron injection capabilities.

The cathode 131 may be formed of a metal, an alloy, an electrically conductive compound, or a mixture thereof, each of which has a low work function. The cathode 131 may be formed as a transmissive electrode by forming a thin film of, for example, lithium (Li), magnesium (Mg), aluminum (Al), aluminium-lithium (Al—Li), calcium (Ca), magnesium-indium (Mg—In), magnesium-silver (Mg—Ag), or the like. Various changes may be made, for example, in order to obtain a top emission-type organic light-emitting device, the transmissive electrode is formed of ITO, IZO, or the like.

Optionally, the organic light-emitting device 100 may have a resonance structure. In order to match resonance distances of the red, green, and blue emission regions R, G, and B, a resonance layer (not shown) may be used. The resonance layer may be formed by forming the electron transfer layer 127 or the hole transfer layer 122 to have different thicknesses for the respective red, green, and blue emission regions R, G, and B. Alternatively, the resonance layer may be formed as a separate layer between the anode 111 and the cathode 131.

Thus far, embodiments in which the blue emission layer is used as a common emission layer have been described. Alternatively, the red emission layer or the green emission layer may be used as a common emission layer. That is, the red emission layer may be formed as a common emission layer on the hole transfer layer, and the green emission layer and blue emission layer may be patterned on the red common emission layer. Alternatively, the green emission layer may be formed as a common emission layer on the hole transfer layer, and the red emission layer and the blue emission layer may be patterned on the green common emission layer.

When the red emission layer is used as a common emission layer, the p-type dopant used in the blue emission layer in the above-described embodiment may be used as a second dopant in the red emission layer. Similarly, when the green emission layer is used as a common emission layer, the p-type dopant may be used as a second dopant in the green emission layer. Since the p-type dopant is used in a common emission layer, holes may be generated in the host, thereby increasing the hole transporting efficiency of the host.

An example of an organic light emitting device according to an embodiment of the present invention has been described with reference to the organic light-emitting device 100 shown in FIG. 1. However, if necessary, various changes may be made, and for example, if necessary, any one of the red emission layer 125R and the green emission layer 125G may be formed, a hole blocking layer may be formed between the emission layer 125 and the electron transfer layer 127, an electron blocking layer may be formed between the emission layer 125 and the hole transfer layer 122, or layers may be formed in order from the cathode on a substrate.

The following Examples are presented for illustrative purposes only, and no not limit the scope of the present invention.

Example 1

As an anode, a 15 Ω/cm² (500 Å) Corning ITO glass substrate was cut to a size of 50 mm×50 mm×0.7 mm, washed with ultrasonic waves in isopropyl alcohol and pure water for 5 minutes each, and then cleaned with UV and ozone for 30 minutes. MTDATA was vacuum-deposited on the ITO glass substrate to form a hole injection layer with a thickness of 100 Å. Then, an emission layer was formed on the hole injection layer to have a thickness of 400 Å using 94 wt % of TBADN as a blue host, 5 wt % of DPAVBI as a blue dopant, and 1 wt % of F4TCNQ as a p-type dopant. Al was vacuum-deposited on the emission layer to form a cathode with a thickness of 1,200 Å, thereby completing the manufacture of an organic light-emitting device.

Example 2

An organic light-emitting device was manufactured in the same manner as in Example 1, except that the weight ratio of TBADN:DPAVBI:F4TCNQ in the emission layer was 93:5:2 instead of 94:5:1.

Comparative Example 1

An organic light-emitting device was manufactured in the same manner as in Example 1, except that the weight ratio of TBADN:DPAVBI:F4TCNQ in the emission layer was 95:5:0 instead of 94:5:1.

Comparative Example 2

An organic light-emitting device was manufactured in the same manner as in Example 1, except that the weight ratio of TBADN:DPAVBI:F4TCNQ in the emission layer was 92:5:3 instead of 94:5:1.

Comparative Example 3

An organic light-emitting device was manufactured in the same manner as in Example 1, except that the weight ratio of TBADN:DPAVBI:F4TCNQ in the emission layer was 90:5:5 instead of 94:5:1.

Table 1 summarizes the structures of the organic light-emitting devices of Examples 1 and 2, and Comparative Examples 1 through 3.

TABLE 1

| Example 1 | ITO(500 Å)/MTDATA(100 Å)/TBADN(94%): DPAVBI(5%):F4TCNQ(1%)(400 Å)/Al(1200 Å) |
|---|---|
| Example 2 | ITO(500 Å)/MTDATA(100 Å)/TBADN(93%): DPAVBI(5%):F4TCNQ(2%)(400 Å)/Al(1200 Å) |
| Comparative Example 1 | ITO(500 Å)/MTDATA(100 Å)/TBADN(95%): DPAVBI(5%):F4TCNQ(0%)(400 Å)/Al(1200 Å) |
| Comparative Example 2 | ITO(500 Å)/MTDATA(100 Å)/TBADN(92%): DPAVBI(5%):F4TCNQ(3%)(400 Å)/Al(1200 Å) |
| Comparative Example 3 | ITO(500 Å)/MTDATA(100 Å)/TBADN(90%): DPAVBI(5%):F4TCNQ(5%)(400 Å)/Al(1200 Å) |

Figure 3:
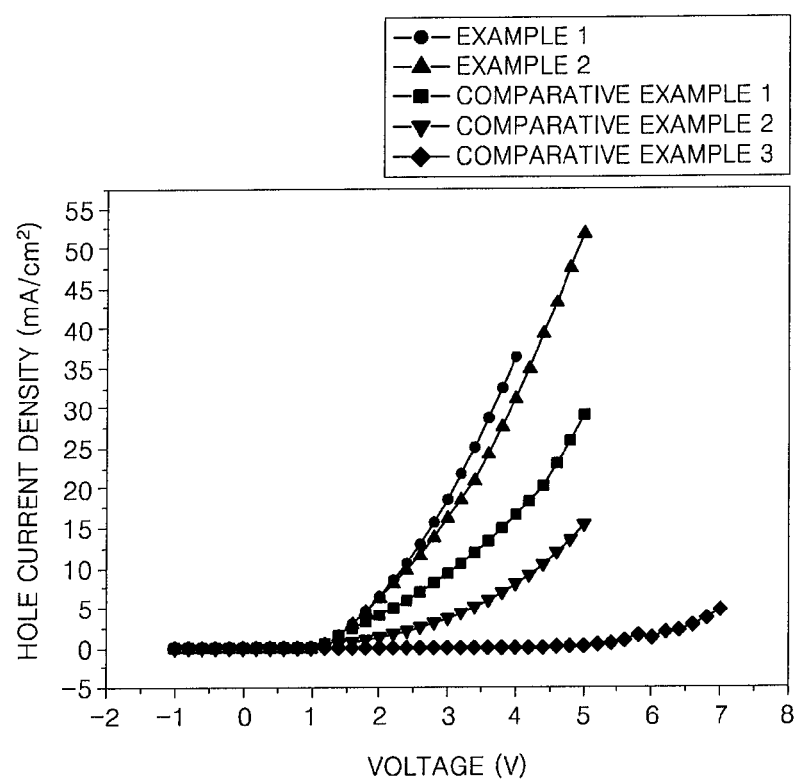
FIG. 3 is a graph comparing hole current density vs. voltage of the organic light-emitting devices of Examples 1 and 2 and Comparative Examples 1 through 3.

FIG. 3 is a graph of hole current density vs. voltage of the organic light-emitting devices of Examples 1 and 2, and Comparative Examples 1 through 3. The hole current density was measured using a PR650 spectrometer.

Referring to FIG. 3, Example 1 had the highest current density, followed (in descending order) by Example 2, Comparative Example 1, Comparative Example 2, and Comparative Example 3. That is, when F4TCNQ is doped at 2 wt % (Examples 1 and 2), the current density is increased compared to when F4TCNQ is not doped (Comparative Example 1). When F4TCNQ is doped at 3 wt % (Comparative Example 2), the current density is reduced compared to when F4TCNQ is not doped (Comparative Example 1). When F4TCNQ is doped at 5 wt % (Comparative Example 3), the current density is seriously reduced. It is deemed that when the amount of F4TCNQ is increased, electrons with the HOMO energy level of DPAVBI as an emission dopant are more likely to be transferred to the LUMO energy level of F4TCNQ such that the HOMO energy level of F4TCNQ serves as a new trap-site for holes of TBADN.

The hole transporting efficiency of a common emission layer may be increased by using a p-type dopant with a LUMO energy level that is close to a HOMO energy level of the host.

While the present invention has been illustrated and described with reference to certain exemplary embodiments, it will be understood by those of ordinary skill in the art that various changes can be made to the described embodiments without departing from the spirit and scope of the present invention as defined by the following claims.

What is claimed is:
1. An organic light-emitting device comprising:
a substrate;
a first electrode layer and a second electrode layer on the substrate and parallel to the substrate, the first and second electrode layers facing each other;
an emission layer between the first electrode layer and the second electrode layer, wherein the emission layer comprises a first emission region, a second emission region, and a third emission region, wherein the emission layer comprises a first common emission layer in the first emission region, the second emission region, and the third emission region; a second emission layer in the second emission region between the first common emission layer and the second electrode layer; and a third emission layer in the third emission region between the first common emission layer and the second electrode layer, and wherein the first common emission layer comprises a first host, a first dopant, and a p-type dopant.

2. The organic light-emitting device of claim 1, wherein a difference between a lowest unoccupied molecular orbital (LUMO) energy level of the p-type dopant and a highest occupied molecular orbital (HOMO) energy level of the first host is about 0.2 to about 1.0 eV.

3. The organic light-emitting device of claim 1, wherein the p-type dopant has a LUMO energy level that is equal to or less than 5.5 eV.

4. The organic light-emitting device of claim 1, wherein the p-type dopant comprises 2,3,5,6-tetrafluoro-7,7',8,8'-tetracyanoquinodimethane (F4TCNQ), 7,7',8,8'-tetracyanoquinodimethane (TCNQ), perylene-3,4,9,10-tetracarboxylic-3,4,9,10-dianhydride (PTCDA), a 1,3,2-dioxaborine derivative, $FeCl_3$, $FeF_3$, or $SbCl_5$.

5. The organic light-emitting device of claim 1, wherein an amount of the p-type dopant is about 0.5 to about 3 wt % based on a total weight of the first common emission layer.

6. The organic light-emitting device of claim 1, wherein the first emission region is a blue emission region, the second emission region is a red emission region, and the third emission region is a green emission region.

7. The organic light-emitting device of claim 6, wherein the first common emission layer is a blue common emission layer.

8. The organic light-emitting device of claim 7, wherein the first host comprises $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, or distyrylarylene (DSA).

9. The organic light-emitting device of claim 7, wherein the first dopant comprises a blue phosphorescent dopant or a blue fluorescent dopant.

10. The organic light-emitting device of claim 7, wherein the first dopant comprises $F_2$Irpic, $(F_2ppy)_2$Ir(tmd), Ir(dfppz)$_3$, ter-fluorene, 4,4'-bis(4-diphenylaminostyryl)biphenyl (DPAVBi), or 2,5,8,11-tetra-t-butylperylene (TBPe).

11. The organic light-emitting device of claim 6, wherein the first common emission layer comprises a red common emission layer or a green common emission layer.

12. The organic light-emitting device of claim 1, further comprising a hole injection layer or a hole transfer layer between the first electrode layer and the emission layer.

13. The organic light-emitting device of claim 1, further comprising an electron injection layer or an electron transfer layer between the second electrode layer and the emission layer.

14. The organic light-emitting device of claim 1, further comprising an electron blocking layer between the hole injection layer or the hole transfer layer and the emission layer.

15. The organic light-emitting device of claim 1, further comprising a hole blocking layer between the emission layer and the electron transfer layer or the electron injection layer.

16. The organic light-emitting device of claim 1, further comprising a resonance layer between the emission layer and the second electrode layer.

17. The organic light-emitting device of claim 16, wherein the resonance layer comprises an electron transfer layer.

18. The organic light-emitting device of claim 17, wherein the resonance layer has a thickness that varies in the first emission region, the second emission region, and the third emission region according to resonance distances of the first emission region, the second emission region, and the third emission region.

19. The organic light-emitting device of claim 1, wherein the first electrode layer is an anode, and the second electrode layer is a cathode.

20. The organic light-emitting device of claim 1, wherein the first electrode layer is a cathode, and the second electrode layer is an anode.

* * * * *